United States Patent
Moore, Jr. et al.

(10) Patent No.: US 7,391,474 B2
(45) Date of Patent: Jun. 24, 2008

(54) DISPLAY INTERFACE SYSTEMS AND METHODS

(75) Inventors: Ralph David Moore, Jr., Greensboro, NC (US); Michael Joseph Fernald, Kernersville, NC (US)

(73) Assignee: Analog Devices, Inc., Norwood, MA (US)

( * ) Notice: Subject to any disclaimer, the term of this patent is extended or adjusted under 35 U.S.C. 154(b) by 565 days.

(21) Appl. No.: 11/203,072

(22) Filed: Aug. 12, 2005

(65) Prior Publication Data

US 2006/0077087 A1   Apr. 13, 2006

Related U.S. Application Data

(60) Provisional application No. 60/618,935, filed on Oct. 13, 2004.

(51) Int. Cl.
*H04N 5/52* (2006.01)
*H03M 1/12* (2006.01)

(52) U.S. Cl. .......................... 348/572; 348/678

(58) Field of Classification Search ......... 348/572–573, 348/678, 673, 254–255, 690, 689; 341/155, 341/158; *H04N 5/52; H03M 1/12*
See application file for complete search history.

(56) References Cited

U.S. PATENT DOCUMENTS

| | | | | | |
|---|---|---|---|---|---|
| 5,448,306 | A | * | 9/1995 | Koyama | 348/678 |
| 5,719,638 | A | * | 2/1998 | Noda | 348/572 |
| 5,777,686 | A | | 7/1998 | Jennes et al. | 348/537 |
| 5,835,155 | A | * | 11/1998 | Jennes et al. | 348/536 |
| 5,841,488 | A | * | 11/1998 | Rumreich | 348/694 |
| 6,002,445 | A | * | 12/1999 | Urayama | 348/572 |
| 6,016,161 | A | | 1/2000 | Robinson | 348/187 |
| 6,377,313 | B1 | | 4/2002 | Yang et al. | 348/630 |
| 6,400,301 | B1 | | 6/2002 | Kulhalli et al. | 341/155 |
| 6,542,185 | B1 | | 4/2003 | Bogardus | 348/223.1 |
| 6,580,382 | B2 | | 6/2003 | Yung | 341/139 |
| 6,750,910 | B1 | | 6/2004 | Bilhan | 348/243 |
| 6,774,942 | B1 | | 8/2004 | Salcedo et al. | 348/243 |

OTHER PUBLICATIONS

Application Note 734: "Video Basics", Maxim Integated Products, Sunnyvale, California Apr. 17, 2001, pp. 1-11.
Application Note AN10157-01: "TDA9965 CCD Signal Processor", Phillips Semiconductor Sep. 2002, pp. 1-17.
Nishitani S et al: "45.3 : Automatic Adjustment Method of Parameters in CRT Interface Circuit for LCD Monitor" Proceedings of the 1998 Conference on Society for Information Display (SID'98), May 1998, pp. 1153-1156, XP007008699 p. 1155, col. 1, line 4-col. 2, line 4; figures 3, 4.

(Continued)

*Primary Examiner*—Trang U Tran
(74) *Attorney, Agent, or Firm*—Koppel, Patrick, Heybl & Dawson (57) ABSTRACT

Display interface embodiments are provided to capture various types of analog video signals and digitize them for presentation on advanced digital displays (e.g., computer displays and television displays). The embodiments include at least an error converter channel and a reference converter channel that can each amplify an analog input signal S with a fixed gain G and a programmed gain g and convert the amplified signal to a corresponding digital code. The embodiments also include a channel controller that is configured to conduct process steps that adjust the transfer function of the error converter channel to conform to (e.g., matches) the transfer function of the reference converter channel.

20 Claims, 3 Drawing Sheets

OTHER PUBLICATIONS

Siegordner J et al: "Fast and parallel read-out scheme for optimum display of an a-si:H image sensor" Sensors and Actuators A, Elsevier Sequoia S.A., Lausanne, CH, vol. 71, No. 3, Dec. 1, 1998, pp. 219-222, XP004140099 ISSN: 0924-4247 figure 2.

* cited by examiner

DISPLAY INTERFACE SYSTEMS AND METHODS

CROSS REFERENCES TO RELATED APPLICATIONS

This application claims the benefit of U.S. Provisional Application Ser. No. 60/618,935 filed Oct. 13, 2004.

BACKGROUND OF THE INVENTION

1. Field of the Invention

The present invention relates generally to display interface systems.

2. Description of the Related Art

Display interface systems typically capture various types of analog video signals (e.g., RGB or YPbPr signals) and digitize them for presentation on advanced digital displays (e.g., computer displays and television displays). These interfaces generally include three converter channels that correspond to three video colors in addition to circuits directed to pixel clock generation, sampling phase control and output data formatting.

Various signal conditioning errors in a display interface can substantially degrade the quality of the resultant display. For example, a portion of analog input signals will be lost unless the dc level of these signals is successfully clamped to levels compatible with the processing circuits of each converter channel. For a second example, output code offset errors in the three converter channels will generate undesirable brightness variations in display colors. For a third example, channel gain errors will generate contrast variations in display colors.

Although some display interfaces have included clamping and offset control circuits which are intended to automatically restore and balance signal reference levels to thereby reduce offset differences, they have typically failed to provide controls that effectively include and integrate control of all display interface signal conditioning processes.

BRIEF SUMMARY OF THE INVENTION

The present invention is directed to display interface embodiments that have enhanced system performance. The novel features of the invention are set forth with particularity in the appended claims. The invention will be best understood from the following description when read in conjunction with the accompanying drawings.

DETAILED DESCRIPTION OF THE INVENTION

FIGS. 1-4 illustrate display interface embodiments of the present invention that include at least an error converter channel and a reference converter channel that can each amplify an analog input signal S with a fixed gain G and a programmed gain g and convert the amplified signal to a corresponding digital code. The embodiments include a channel controller that is configured to conduct process steps that adjust the transfer function of the error converter channel to conform to (e.g., matches) the transfer function of the reference converter channel.

Figure 1:
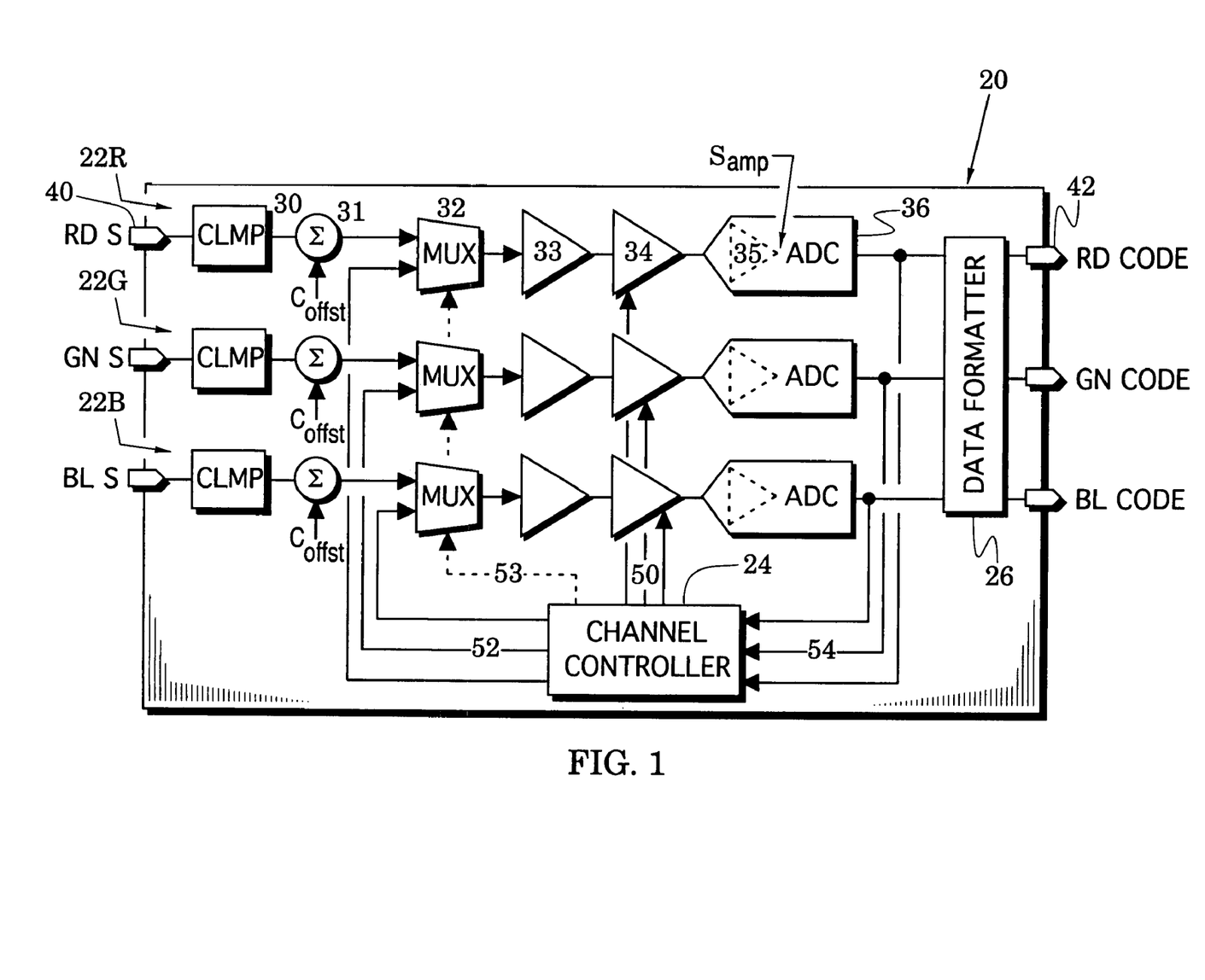
FIG. 1 is a diagram of a display interface embodiment of the present invention.

In particular, FIG. 1 illustrates a display interface embodiment 20 which includes three converter channels 22R, 22G and 22B, a data formatter 24, and a channel controller 26. Each of the converter channels includes a signal clamp 30, a signal multiplexer (MUX) 32, a fixed-gain input buffer amplifier 33, a programmed-gain amplifier (PGA) 34, and an analog-to-digital converter (ADC) 36.

In each converter channel, the clamp 30 is coupled to an input port 40 that receives an analog input signal S, the multiplexer 32 is coupled between the clamp 30 and the fixed-gain amplifier 33, and the PGA 34 is coupled between the fixed-gain amplifier 33 and the ADC 36. The data formatter 26 is positioned to format the output digital code of all converter channels and provide this formatted code to output ports 42. As typically used in a video display system, the converter channels 22R, 22G and 22B provide red, green and blue video signals and, accordingly, they may subsequently be referred to as red, green and blue converter channels.

The data formatter 26 receives an output digital code from each of the ADCs 36 and formats this code into video display formats that are compatible with various video display systems. For example, one video signal format is a red, green, blue (RGB) format that is suitable for many computer systems. Another exemplary video format is a Y, Pr, Pb signal format that is suitable for many television systems. In this format, a Y signal contains the brightness (luma) and synchronizing information, the color-difference signal Pr contains the red signal R minus the Y signal, and the color-difference signal Pb contains the blue signal B minus the Y signal.

The data formatter 26 provides the formatted signals at output ports 42. For descriptive purposes, the output signals at these ports may subsequently be referred to as red (rd) code, green (gn) code and blue (bl) code signals. Alternatively, these designations may also be used to apply to the output signals of the ADCs 36 of the converter channels 22R, 22G and 22B.

In a system embodiment, each of the ADCs 36 may also include a fixed-gain front-end buffer 35 (shown in broken lines) that further amplifies the analog input signal S before it is converted by the ADC of each converter channel to its respective output code. In this embodiment, the analog input signal S of each converter channel is amplified by a fixed gain G which comprises the sum of the fixed gains of the input buffer 33 and the front-end buffer 35 and is also amplified by a programmed gain g of the PGA 34.

As exemplified in the red converter channel 22R, the channel controller 24 provides a digital gain word 50 to the PGA 34 and this gain word determines the value of the programmed gain g. As further exemplified in the red converter channel 22R, the controller also provides analog calibration signals 52 (e.g., first and second analog signals $S^1$ and $S_2$ having a selected signal difference $\Delta S$), provides command signals 53 to the multiplexers 53 to selectively pass these analog calibration signals, and receives corresponding digital codes 54 from the respective ADC 36.

The digital codes at the output ports 42 are typically used to generate a display on a display device (e.g., a computer display screen or a television display screen). In order to enhance the quality of the resultant display, at least three types of signal conditioning are generally performed along the analog signal paths that precede the analog-to-digital conversion process inside each ADC 36.

In a first signal conditioning process, the clamps 30 establish a predetermined dc-level for the incoming analog signal S. This level shifting insures that all incoming analog signals will fall within the reference voltage range ($-V_{ref}$ to $+V_{ref}$) of each ADC 36. In order to avoid interference in the conversion process, the clamping is generally performed somewhere in the horizontal blanking interval of each scan line of video signal.

Figures 2, 3:
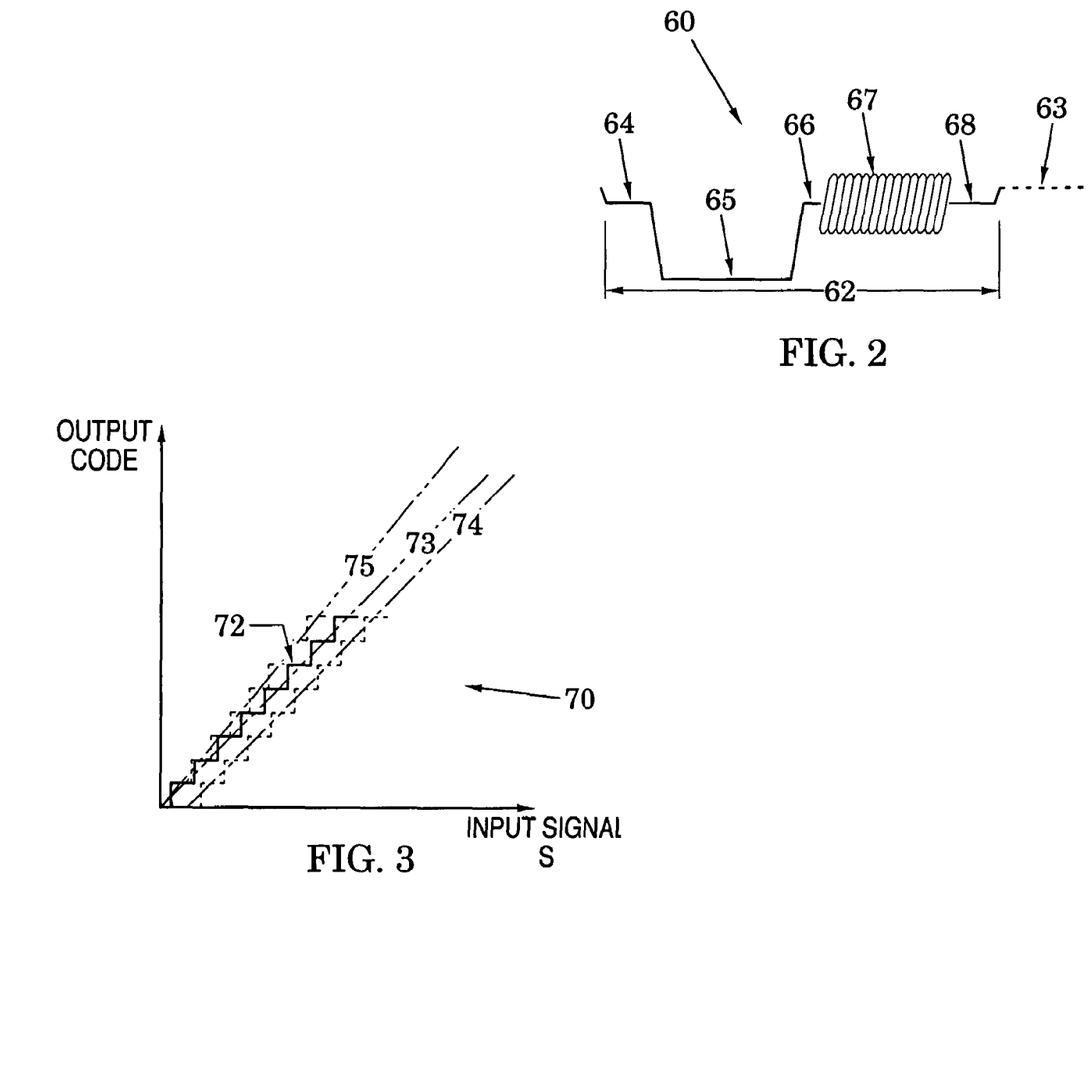
FIG. 2 is a plot of an initial portion of a video scan line.
FIG. 3 is a diagram of the transfer function of a converter channel in the display interface of FIG. 1.

For example, FIG. 2 illustrates a horizontal blanking interval 62 in a video scan line 60 which is intended to generate one horizontal display line in a system display. The active video portion 63 of the scan line contains display information and this active portion begins after the nonactive horizontal blanking interval 62. In the blanking interval, a sync tip 65 is typically positioned between a "front porch" 64 and a "breezeway" 66 and a color burst 67 is positioned between the breezeway and a "back porch" 68.

Clamping is typically done during the back porch 68 or the sync tip 65 and is generally accomplished by injecting a suitable potential into a capacitor that is inserted in the analog signal path (e.g., ahead of each clamp 30 in FIG. 1). Some video signals (e.g., Y, Pr, Pb signals) are configured so that the clamped level is the midpoint potential of the video signal whereas other video signals (e.g., RGB signals) are configured so that the clamped level is the lowest potential of the video signal.

With the dc level of each analog input signal S appropriately established by a respective one of the clamps 30, other signal conditioning processes insure that the analog input signal is configured to provide a full-scale input (alternatively, a predetermined portion of the full-scale input) to each of the ADCs 36. These processes are generally directed to reduction of errors in signal offset and signal gain.

To illustrate offset and gain errors, FIG. 3 provides a graph 70 that illustrates a small lower portion of a stepped transfer function 72 of one of the converter channels 22 of FIG. 1. The transfer function 72 is centered about a broken line 73 and indicates digital output codes that are provided (at output ports 42 of FIG. 1) in response to analog input signals S (at input ports 40 of FIG. 1). An offset error in a converter channel will cause the transfer function to move to a new location in which it is centered, for example, about a broken line 74 that is horizontally translated from the broken line 73.

In contrast, a gain error in a converter channel will cause the transfer function to rotate to a new location in which it is centered, for example, about a broken line 75 that is tilted from the broken line 73. In a video display, a video offset error degrades display brightness while a video gain error degrades display contrast. It is generally desired that the brightness and contrast of the converter channel display codes have a selected relationship. For example, the predetermined relationship may be that they are matched.

The offset error can generally be corrected by providing, for each converter channel, a summer which is positioned after the channel's clamp 30 to receive an analog offset correction. For example, the display interface embodiment 20 of FIG. 1 inserts a summer 31 between the clamp 30 and the multiplexer 32 of each converter channel. An analog offset correction $C_{offset}$ can be generated, for example, with a digital-to-analog converter (not shown) and provided to the summer 31 where it is summed with a corresponding input analog signal S. With respect to FIG. 3, the analog offset correction $C_{offset}$ would be chosen to horizontally shift the transfer function from the broken line 74 back to the broken line 73.

The level of the back porch 68 of FIG. 2 generally indicates the black level of the video scan line 60. Preferably, this level would correspond to the lowest point of the transfer function 72 of FIG. 3. Accordingly, the output code of each converter channel 22 of FIG. 1 can be sensed during the back porch 68 and the analog offset correction $C_{ofst}$ of that channel adjusted until its output code is the correct code for representing the black level.

In another signal conditioning process of the invention, the signal gain of one or more of the converter channels is controllably adjusted to provide a full-scale input (or a predetermined portion of the full-scale input) to the channel's ADC 36 and to have a predetermined relationship (e.g., matched) to the signal gain of the other channels.

As previously described, the analog input signal S of each converter channel 24 in FIG. 1 is amplified by a fixed gain G which comprises the sum of the fixed gains of the input buffer 33 and the front-end buffer 35 and is also amplified by a programmed gain g of the PGA 34. In an interface display embodiment, the programmed gain g is part of the total gain 1+g of the PGA 38. For example, the programmed gain g may be controllably varied from 0 to 1 so that the total gain of the PGA varies from 1 to 2.

Accordingly, each converter channel 22 of FIG. 1 applies a gain G(1+g) to the analog input signal S before converting the resulting amplified signal $S_{amp}$ to a corresponding digital code $C_{out}$. As indicated in the red converter channel of FIG. 1, the amplified signal $S_{amp}$ is the output of the front-end buffer 35 and is the analog signal actually converted to a corresponding digital code.

In accordance with a feature of the present invention, it is assumed that one of the converter channels 22 of FIG. 1 is used as a reference converter channel so that the remaining converter channels can be considered as error converter channels. For each of the error converter channels, it is then assumed that any gain difference between that channel and the reference converter channel is a gain error in the error converter channel.

The method embodiments of the invention are directed to the reduction (preferably, the elimination) of the gain error which can be characterized by error parameters. Therefore, in terms of the analog input signal S, channel fixed gain G, and channel programmed gain g, the amplified analog signal $S_{amp}$ in the reference converter channel is $$S_{amp} = S_{in}G(1+g) \tag{1}$$

and the amplified analog signal $S_{amp}$ in the error converter channel is $$S_{amp} = S_{in}GE_{rr1}(1+gE_{rr2}) \tag{2}$$

wherein $E_{rr1}$ is a first error parameter that represents error in the fixed gain G of the error converter channel and $E_{rr2}$ is a second error parameter that represents error in the programmed gain g of the error converter channel.

It is, of course, highly desirable that these fixed and programmed gain errors be substantially reduced. In accordance with another feature of the present invention, a first correction parameter $\alpha$ is proposed to substantially reduce the programmed portion of the gain error in the error converter channel. The first correction parameter $\alpha$ is a factor that adjusts for differences in the programmed gain g of the converter channels. The reference converter channel will still have a programmed gain of 1+g but each error converter channel will now have a programmed gain of $1+\alpha g E_{rr2}$.

In addition, a second correction parameter $\beta$ is proposed to substantially reduce the fixed portion of the gain error. The second correction parameter $\beta$ is a constant that is added to the programmed gain in the error converter channel to adjust for errors in its fixed gain. The total gain of the reference continues to be G(1+g) but now each error converter channel has a total gain of $GE_{rr1}(1+(\alpha g+\beta)E_{rr2})$.

The total gain in each error converter channel can be expanded to $G(E_{rr1}+\alpha gE_{rr1}E_{rr2}+\beta E_{rr1}E_{rr2})$ and when this term is compared to the total gain of G(1+g) in the reference converter channel, it becomes apparent that the total gain in the error converter channel will match that in the reference converter channel if $$1+g=E_{rr1}+\alpha gE_{rr1}E_{rr2}+\beta E_{rr1}E_{rr2}. \quad (3)$$

In another feature of the present invention, it is proposed that the first correction parameter $\alpha$ be defined as $$\alpha = \frac{1}{E_{rr1}E_{rr2}}. \quad (4)$$

When this definition of the first correction parameter is substituted into equation (3), it is found that the second correction parameter $\beta$ is given by $$\beta = \frac{1 - E_{rr1}}{E_{rr1}E_{rr2}}. \quad (5)$$

In accordance with equations (3), (4) and (5), gains in the error converter channel can be substantially reduced if appropriate values can be found for the first and second error parameters $E_{rr1}$ and $E_{rr2}$.

It has been found that the first error parameter $E_{rr1}$ can be obtained by applying a selected gain value of the programmed gain g and then determining the first error parameter $E_{rr1}$ as $\Delta C_{err}/\Delta C_{ref}$ wherein $\Delta C_{err}$ and $\Delta C_{ref}$ are code differences of the error converter channel and the reference converter channel that correspond to an analog input signal difference $\Delta S$.

In particular, first and second analog signals $S_1$ and $S_2$ (having a signal difference $\Delta S = S_2 - S_1$) are successively applied to the error and reference converter channels while the programmed gain g is maintained at a selected gain value. Successive corresponding digital codes $C_{err2}$ and $C_{err1}$ having a code difference $\Delta C_{err}$ are produced by the error converter channel and successive corresponding digital codes $C_{ref2}$ and $C_{ref1}$ having a code difference $\Delta C_{ref}$ are produced by the reference converter channel.

The gain relationships of equations (1) and (2) are produced when it is observed that in response to the applied signal difference $\Delta S$, the amplifier transfer function in the error converter channel is $$\frac{[(S_2 - S_{offst}) - (S_1 - S_{offst})][GE_{rr1}(1 + gE_{rr2})]}{[(S_2 - S_{off}) - (S_1 - S_{off})]} = GE_{rr1}(1 + gE_{rr2}) \quad (6)$$

and the amplifier transfer function in the reference converter channel is $$\frac{\Delta SG(1 + g)}{\Delta S} = G(1 + g). \quad (7)$$

It is important to note that an offset error signal $S_{offst}$ has been included in equation (6) and that it cancels out of the amplifier transfer function in the error converter channel. The ratio of equation (6) to equation (7) is $$\frac{GE_{rr1}(1 + gE_{rr2})}{G(1 + g)} \quad (8)$$

and for a programmed gain g of zero, this ratio reduces to $E_{rr1}$.

Equation (8) shows that the first error parameter $E_{rr1}$ can be obtained from a ratio of differences in amplified analog signals in the error and reference converter channels in response to an analog input signal difference $\Delta S$. However, an equivalent ratio is given by the ratio of code differences $\Delta C_{err}/\Delta C_{ref}$ and the code differences are easy to measure since they simply involve code signals produced by the error and reference converter channels. As shown in FIG. 1, the digital codes 54 are provided to the channel controller 24 so that it can determine the first error parameter $E_{rr1}$.

The first error parameter $E_{rr1}$ can therefore be determined while applying a selected gain value of the programmed gain g and providing an analog input signal difference $\Delta S$. To accomplish this, the channel controller 24 of FIG. 1 applies a selected digital gain word 50 to the appropriate PGA 34. It also applies first and second analog signals $S_1$ and $S_2$ (having the selected signal difference $\Delta S$) as the analog calibration signals 52, and provides command signals 53 to the multiplexers 32 to route these analog calibration signals to the appropriate converter channels.

It has also been found that the second error parameter $E_{rr2}$ can be found by applying a selected analog value $S_{slctd}$ of the analog input signal and then determining the second error parameter $E_{rr2}$ as $2[(C_{err2}/C_{err1})/(C_{ref2}/C_{ref1})]-1$ wherein $C_{err1}$ and $C_{err2}$ are codes from the error converter channel and $C_{ref2}$ and $C_{ref1}$ are codes from the reference converter channel that respectively correspond to first and second programmed gains $g_1$ and $g_2$.

The above relationships follow when it is observed that successive programmed gains of $g_1$ and $g_2$ will provide a ratio of amplified signals in the error converter channel of $$\frac{(S_{slctd} - S_{off})GE_{rr1}(1 + g_2E_{rr2})}{(S_{slctd} - S_{off})GE_{rr1}(1 + g_1E_{rr2})} = \frac{(1 + g_2E_{rr2})}{(1 + g_1E_{rr2})} \quad (9)$$

and a ratio of amplified signals in the reference converter channel of $$\frac{S_{pre}G(1 + g_2)}{S_{pre}G(1 + g_1)} = \frac{(1 + g_2)}{(1 + g_1)}. \quad (10)$$

The ratio of equation (9) to equation (10) is $$\frac{1 + g_1 + g_2E_{rr2} + g_1g_2E_{rr2}}{1 + g_2 + g_1E_{rr2} + g_1g_2E_{rr2}} \quad (11)$$

which, for programmed gains of $g_2=1$ and $g_1=0$, reduces to $$\frac{1 + E_{rr2}}{2}. \quad (12)$$

As previously done when determining the first error parameter $E_{rr1}$, an offset error signal $S_{ofst}$ has again been included and it is noted that it cancels out of the amplifier transfer function in the error converter channel.

Multiplying expression (12) by 2 and subtracting 1 produces the second error parameter $E_{rr2}$. This demonstrates that the second error parameter can be obtained from appropriate ratios of amplified signals in the error and reference converter channels but equivalent ratios are obtained for equivalent digital codes which are relatively easy to obtain from the code outputs of the error and reference converter channels.

Therefore, as stated above, the second error parameter $E_{rr2}$ is given by $2[(C_{err2}/C_{err1})/(C_{ref2}/C_{ref1})]-1$ wherein $C_{err1}$ and $C_{err2}$ are codes from the error converter channel and $C_{ref2}$ and $C_{ref1}$ are codes from the reference converter channel that respectively correspond to first and second programmed gains $g_1$ and $g_2$. These codes are obtained while applying a selected analog value of the analog input signal to the error and reference converter channels.

In gain adjustment embodiments of the invention, the channel controller 24 of FIG. 1 can thus receive output digital codes 54 from the reference and error converter channels and obtain the first and second error parameters $E_{rr1}$ and $E_{rr2}$. The channel controller can then find the first and second correction parameters $\alpha$ and $\beta$ from equations (4) and (5) and modify the programmed gain of the error converter channel to $\alpha g+\beta$ with the digital gain word (50 in FIG. 1).

This process will substantially match the error channel's gain to that of the reference converter channel. The same procedure can be followed to match the gain of other error converter channels to that of the selected reference converter channel. When the programmed gain g is expressed as a digital code, it can simply be multiplied in the channel controller by the first correction parameter a but the second correction parameter $\beta$ must be converted to a corresponding gain code prior to adding it to the gain expression $\alpha g$.

For example, if the programmed gain is a 9-bit word, then the programmed gain word g can vary from 0 to 511 in 9-bit codes. In one embodiment of the display interface system 20 of FIG. 1, the programmed gain would then be 1+g/511 wherein g would vary from 0 to 511 in 9-bit codes so that the programmed gain varies from 1 to 2.

Figure 4:
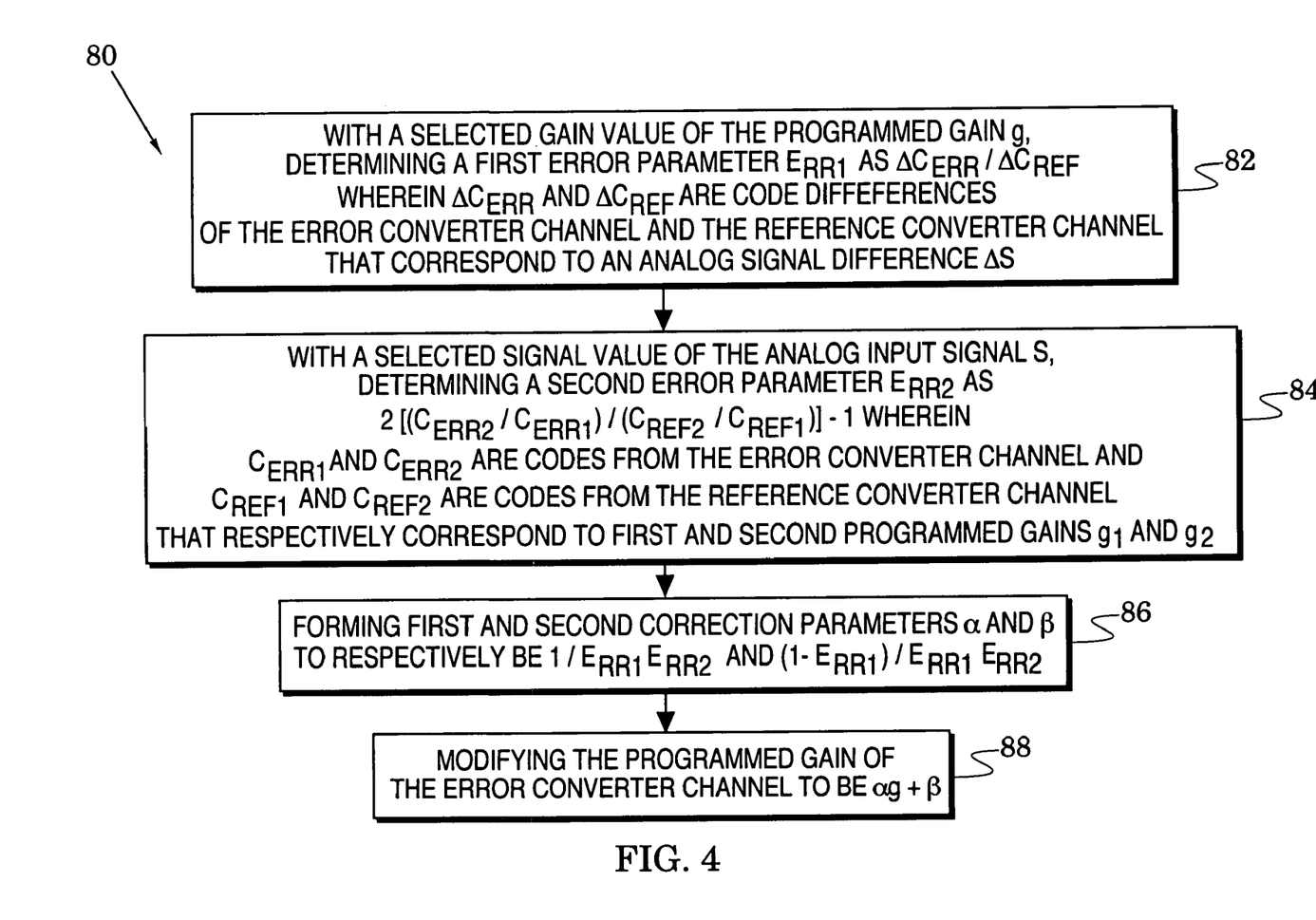
FIG. 4 is a flow chart that illustrates correction of transfer functions in the display interface of FIG. 1.

FIG. 4 illustrates a flow chart 80 that summarizes the processes described above for adjusting transfer functions of an error converter channel and a reference converter channel that can each amplify an analog input signal S with a fixed gain G and a programmed gain g and convert the amplified signal to a corresponding digital code.

With a selected gain value of the programmed gain g, a first process step 82 determines a first error parameter $E_{rr1}$ as $\Delta C_{err}/\Delta C_{ref}$ wherein $\Delta C_{err}$ and $\Delta C_{ref}$ are code differences of the error converter channel and the reference converter channel that correspond to an analog input signal difference $\Delta S$.

With a selected signal value of the analog input signal S, a second process step 84 determines a second error parameter $E_{rr2}$ as $2[(C_{err2}/C_{err1})/(C_{ref1}$ and $C_{ref2})]-1$ wherein $C_{err1}$ and $C_{err2}$ are codes from the error converter channel and $C_{ref1}$ and $C_{ref2}$ are codes from the reference converter channel that respectively correspond to first and second programmed gains $g_1$ and $g_2$.

A process step 86 then forms first and second correction parameters $\alpha$ and $\beta$ to respectively be $1/E_{rr1}E_{rr2}$ and $(1-E_{rr1})/E_{rr1}E_{rr2}$. Finally, a process step 88 modifies the programmed gain of the error converter channel to be $\alpha g+\beta$.

The channel controller's measurement of the first and second error parameters $E_{rr1}$ and $_{Err2}$, determination of the first and second correction parameters $\alpha$ and $\beta$, and application of modified programmed gain $\alpha g+\beta$ to error converter channels is preferably done during the nonactive horizontal blanking interval 62 of FIG. 2.

It was previously mentioned that another signal conditioning process concerns controller sensing of the output code of each converter channel 22 of FIG. 1 during the back porch 68 of FIG. 2 and the adjustment of analog offset correction $C_{ofst}$ for that channel until its output code is the correct code for representing the black level.

The channel controller 24 of FIG. 1 can be configured to conduct these gain and offset correction processes in various temporally interleaved manners. That is, gain correction processes can be conducted in nonactive horizontal blanking intervals of selected video scan lines and offset correction processes can be conducted in nonactive horizontal blanking intervals of other video scan lines. To further enhance calibration accuracy, the channel controller may be configured to gather a plurality N of samples of the code differences and codes in processes 82 and 84 of FIG. 4. The controller can then use averages of these samples as it completes the process steps 82-88.

In an operational mode described above, the channel controller measured the first and second error parameters $E_{rr1}$ and $E_{rr2}$, determined the first and second correction parameters $\alpha$ and $\beta$, and modified a programmed gain to $\alpha g+\beta$. The channel controller is preferably configured to control other operational modes.

In one of these operational modes, for example, it is assumed that fixed gain (e.g., gain of the input buffer 33 and front-end buffer 35 of FIG. 1) is the dominant source of channel gain error. Accordingly, the channel controller is configured to assign a value of substantially 1 to the second error parameter $E_{rr2}$ and thus bypass processes exemplified by equations (9) through (12).

In another of these operational modes, attention is mainly directed to programmed gain (e.g., gain of the PGA 34 of FIG. 1) so that the channel controller is configured to assign a value of substantially 1 to the first error parameter $E_{rr1}$ and thus bypass processes exemplified by equations (6) through (8).

The channel controller can be realized with various controller structures such as gate arrays, a suitably-programmed digital processor or combinations thereof.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of adjusting transfer functions of an error converter channel and a reference converter channel that can each amplify an analog input signal S with a fixed gain G and a programmed gain g and convert the amplified signal to a corresponding digital code, the method comprising the steps of:

with a selected gain value of the programmed gain g, determining a first error parameter $E_{rr1}$ as $\Delta C_{err}/\Delta C_{ref}$ wherein $\Delta C_{err}$ and $\Delta C_{ref}$ are code differences of said error converter channel and said reference converter channel that correspond to an analog input signal difference $\Delta S$;

with a selected signal value of said analog input signal S, determining a second error parameter $E_{rr2}$ as $2[(C_{err2}/C_{err1})/(C_{ref1}/C_{ref2})]-1$ wherein $C_{err1}$ and $C_{err2}$ are codes from said error converter channel and $C_{ref1}$ and $C_{ref2}$ are codes from said reference converter channel that respectively correspond to first and second programmed gains $g_1$ and $g_2$;

forming first and second correction parameters α and β to respectively be $1/E_{rr1}E_{rr2}$ and $(1-E_{rr1})/E_{rr1}E_{rr2}$; and modifying the programmed gain of said error converter channel to be αg+β.

2. The method of claim 1, wherein said selected gain value is substantially zero.

3. The method of claim 1, wherein said first and second programmed gains $g_1$ and $g_2$ are substantially zero and one.

4. The method of claim 1, wherein said error converter channel and said reference converter channel each include:
   at least one fixed-gain amplifier;
   a programmed-gain amplifier that operates with said fixed-gain amplifier to amplify said analog input signal into said amplified signal; and
   an analog-to-digital converter that converts said amplified signal into said corresponding digital code.

5. The method of claim 1, wherein said first error parameter determining step includes the steps of:
   setting the programmed gain g of said error converter channel and said reference converter channel to said selected gain value;
   successively applying different first and second analog signals that differ by said signal difference ΔS to said error converter channel and said reference converter channel to thereby obtain first and second digital codes from said error converter and first and second digital codes from said reference converter;
   differencing first and second digital codes from said error converter channel to form said code difference $\Delta C_{err}$; and
   differencing first and second digital codes from said reference converter channel to form said code difference $\Delta C_{ref}$.

6. The method of claim 1, wherein said second error parameter determining step includes the steps of:
   adjusting the analog input signal S to have said selected signal value; and
   successively setting the programmed gain of said error converter channel and said reference converter channel to said first and second programmed gains $g_1$ and $g_2$ to thereby obtain said $C_{err1}$ and $C_{err2}$ codes and said $C_{ref1}$ and $C_{ref2}$ codes.

7. A method of adjusting transfer functions of an error converter channel and a reference converter channel that can each amplify an analog input signal S with a fixed gain G and a programmed gain g and convert the amplified signal to a corresponding digital code, the method comprising the steps of:
   assigning a value of substantially one to a selected one of a first error parameter $E_{rr1}$ and a second error parameter $E_{rr2}$;
   determining the other of said first error parameter $E_{rr1}$ and said second error parameter $E_{rr2}$ with a corresponding one of the following steps:
   a) with a selected gain value of the programmed gain g, determining said first error parameter $E_{rr1}$ as $\Delta C_{err}/\Delta C_{ref}$ wherein $\Delta C_{err}$ and $\Delta C_{ref}$ are code differences of said error converter channel and said reference converter channel that correspond to an analog input signal difference ΔS;
   b) with a selected signal value of said analog input signal S, determining said second error parameter $E_{rr2}$ as $2[(C_{err2}/C_{err1})/(C_{ref1}/C_{ref2})]-1$ wherein $C_{err1}$ and $C_{err2}$ are codes from said error converter channel and $C_{ref1}$ and $C_{ref2}$ are codes from said reference converter channel that respectively correspond to first and second programmed gains $g_1$ and $g_2$;

forming first and second correction parameters α and β to respectively be $1/E_{rr1}E_{rr2}$ and $(1-E_{rr1})/E_{rr1}E_{rr2}$; and modifying the programmed gain of said error converter channel to be αg+β.

8. The method of claim 7, wherein said selected gain value is substantially zero.

9. The method of claim 7, wherein said first and second programmed gains $g_1$ and $g_2$ are substantially zero and one.

10. The method of claim 7, wherein said error converter channel and said reference converter channel each include:
    at least one fixed-gain amplifier;
    a programmed-gain amplifier that operates with said fixed-gain amplifier to amplify said analog input signal into said amplified signal; and
    an analog-to-digital converter that converts said amplified signal into said corresponding digital code.

11. The method of claim 7, wherein said first error parameter determining step includes the steps of:
    setting the programmed gain g of said error converter channel and said reference converter channel to said selected gain value;
    successively applying different first and second analog signals that differ by said signal difference ΔS to said error converter channel and said reference converter channel to thereby obtain first and second digital codes from said error converter and first and second digital codes from said reference converter;
    differencing first and second digital codes from said error converter channel to form said code difference $\Delta C_{err}$; and
    differencing first and second digital codes from said reference converter channel to form said code difference $\Delta C_{ref}$.

12. The method of claim 7, wherein said second error parameter determining step includes the steps of:
    adjusting the analog input signal S to have said selected signal value; and
    successively setting the programmed gain of said error converter channel and said reference converter channel to said first and second programmed gains $g_1$ and $g_2$ to thereby obtain said $C_{err1}$ and $C_{err2}$ codes and said $C_{ref1}$ and $C_{ref2}$ codes.

13. A display interface, comprising:
    reference and error converter channels configured to each amplify an analog input signal S with a fixed gain G and a programmed gain g and convert the amplified signal to a corresponding digital code;
    reference and error multiplexers respectively coupled to said reference and error converter channels; and
    a channel controller configured to perform the steps of:
    assigning a value of substantially one to a selected one of a first error parameter $E_{rr1}$ and a second error parameter $E_{rr2}$;
    determining the other of said first error parameter $E_{rr1}$ and said second error parameter $E_{rr2}$ with a corresponding one of the following steps:
    a) with a selected gain value of the programmed gain g, determining said first error parameter $E_{rr1}$ as $\Delta C_{err}/\Delta C_{ref}$ wherein $\Delta C_{err}$ and $\Delta C_{ref}$ are code differences of said error converter channel and said reference converter channel that correspond to an analog input signal difference ΔS that is provided through said reference and error multiplexers;

b) with a selected signal value of said analog input signal S that is provided through said reference and error multiplexers, determining said second error parameter $E_{rr2}$ as $2[(C_{err2}/C_{err1})/(C_{ref1}/C_{ref2})]-1$ wherein $C_{err1}$ and $C_{err2}$ are codes from said error converter channel and $C_{ref1}$ and $C_{ref2}$ are codes from said reference converter channel that respectively correspond to first and second programmed gains $g_1$ and $g_2$;

forming first and second correction parameters $\alpha$ and $\beta$ to respectively be $1/E_{rr1}E_{rr2}$ and $(1-E_{rr1})/E_{rr1}E_{rr2}$; and modifying the programmed gain of said error converter channel to be $\alpha g+\beta$.

14. The display interface of claim 13, wherein each of said reference and converter channels includes:
    at least one fixed-gain amplifier;
    a programmed-gain amplifier that operates with said fixed-gain amplifier to amplify said analog input signal into said amplified signal; and
    an analog-to-digital converter that converts said amplified signal into said corresponding digital code.

15. The display interface of claim 13, wherein said selected gain value is substantially zero.

16. The display interface of claim 13, wherein said first and second programmed gains $g_1$ and $g_2$ are substantially zero and one.

17. The display interface of claim 13, wherein said error converter channel and said reference converter channel each include:
    at least one fixed-gain amplifier;
    a programmed-gain amplifier that operates with said fixed-gain amplifier to amplify said analog input signal into said amplified signal; and
    an analog-to-digital converter that converts said amplified signal into said corresponding digital code.

18. The display interface of claim 13, wherein said first error parameter determining step includes the steps of:
    setting the programmed gain g of said error converter channel and said reference converter channel to said selected gain value;
    successively applying different first and second analog signals that differ by said signal difference $\Delta S$ to said error converter channel and said reference converter channel to thereby obtain first and second digital codes from said error converter and first and second digital codes from said reference converter;
    differencing first and second digital codes from said error converter channel to form said code difference $\Delta C_{err}$; and
    differencing first and second digital codes from said reference converter channel to form said code difference $\Delta C_{ref}$.

19. The display interface of claim 13, wherein said second error parameter determining step includes the steps of:
    adjusting the analog input signal S to have said selected signal value; and
    successively setting the programmed gain of said error converter channel and said reference converter channel to said first and second programmed gains $g_1$ and $g_2$ to thereby obtain said $C_{err1}$ and $C_{err2}$ codes and said $C_{ref1}$ and $C_{ref2}$ codes.

20. The display interface of claim 13, further including a data formatter configured to adpat said corresponding digital code to selected video formats.

* * * * *